US008897046B2

(12) United States Patent
Muto et al.

(10) Patent No.: US 8,897,046 B2
(45) Date of Patent: Nov. 25, 2014

(54) DC VOLTAGE CONVERSION MODULE, SEMICONDUCTOR MODULE, AND METHOD OF MAKING SEMICONDUCTOR MODULE

(75) Inventors: Gen Muto, Kyoto (JP); Seitaro Mizuhara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 890 days.

(21) Appl. No.: 12/968,977

(22) Filed: Dec. 15, 2010

(65) Prior Publication Data

US 2011/0267023 A1    Nov. 3, 2011

(30) Foreign Application Priority Data

Dec. 25, 2009  (JP) ................................. 2009-295448
Feb. 10, 2010  (JP) ................................. 2010-027128

(51) Int. Cl.
| H02M 1/00 | (2006.01) |
| H01L 23/055 | (2006.01) |
| H01L 25/16 | (2006.01) |
| H01L 23/367 | (2006.01) |
| H02M 7/00 | (2006.01) |

(52) U.S. Cl.
CPC .............. *H01L 23/055* (2013.01); *H01L 25/16* (2013.01); *H01L 23/3677* (2013.01); *H02M 7/003* (2013.01)
USPC ........................................................ 363/147

(58) Field of Classification Search
USPC ................................................. 363/146–147
See application file for complete search history.

(56) References Cited

U.S. PATENT DOCUMENTS

| 6,071,755 | A * | 6/2000 | Baba et al. ..................... 438/106 |
| 2003/0194603 | A1* | 10/2003 | Kim ............................... 429/125 |
| 2004/0037057 | A1 | 2/2004 | Okada |
| 2005/0052888 | A1 | 3/2005 | Takeshima et al. |
| 2007/0104339 | A1* | 5/2007 | Izuchi et al. ................... 381/174 |
| 2008/0121417 | A1* | 5/2008 | Fan ................................ 174/260 |
| 2008/0179737 | A1 | 7/2008 | Haga et al. |
| 2009/0115050 | A1 | 5/2009 | Kasuya et al. |
| 2009/0201005 | A1* | 8/2009 | Noma et al. ................... 323/311 |
| 2009/0316375 | A1* | 12/2009 | Ueda ............................. 361/768 |

FOREIGN PATENT DOCUMENTS

| CN | 1585248 | 2/2005 |
| CN | 101159254 | 4/2008 |
| CN | 101194360 | 6/2008 |
| JP | 10189741 A * | 7/1998 |
| JP | 2004-87594 | 3/2004 |
| JP | 2009-278756 | 11/2009 |

* cited by examiner

*Primary Examiner* — Adolf Berhane
*Assistant Examiner* — Jeffrey Gblende
(74) *Attorney, Agent, or Firm* — Hamre, Schumann, Mueller & Larson, P.C.

(57) ABSTRACT

A DC voltage conversion module includes a substrate, an input terminal, an output terminal, a ground terminal, a DC voltage conversion control element mounted on the substrate, a coil mounted on the substrate and connected to the DC voltage conversion control element and the output terminal, an input-side capacitor mounted on the substrate and connected to the input terminal and the ground terminal, and an output-side capacitor mounted on the substrate and connected to the output terminal and the ground terminal. The input terminal, the output terminal and the ground terminal project in a predetermined projecting direction parallel to each other. The ground terminal is arranged between the input terminal and the output terminal in a direction perpendicular to the projecting direction.

9 Claims, 17 Drawing Sheets

DC VOLTAGE CONVERSION MODULE, SEMICONDUCTOR MODULE, AND METHOD OF MAKING SEMICONDUCTOR MODULE

BACKGROUND OF THE INVENTION

1. Field of the Invention

The present invention relates to a DC voltage conversion module. The present invention also relates to a semiconductor module provided with a heat dissipation plate, and a method of making such a semiconductor module.

2. Description of the Related Art

Conventionally, switching regulators are widely used in electronic devices as a means for converting a DC input voltage into a DC output voltage corresponding to the target device to which the voltage is to be supplied (see JP-A-2009-278756, for example). FIG. 26 of the present application shows an example of conventional switching regulator. The switching regulator X1 includes a controller 90. Upon receiving an input voltage Vin, the controller 90 generates a pulse voltage corresponding to e.g. an output voltage Vout. By adjusting the pulse width, an appropriate output voltage Vout is obtained.

To convert the pulse voltage outputted from the controller 90 to the DC output voltage Vout, the voltage needs to be smoothed. For this purpose, electronic components such as an input-side capacitor Cin, a coil Lout, an output-side capacitor Cout, a diode Di, resistors R1 and R2 are additionally provided on the upstream and downstream sides of the switching regulator X1. To obtain a proper output voltage, selection and arrangement of these electronic components are important. For instance, when the wiring connecting these electronic components is improperly long, inductance or noise is produced in the wiring itself. In particular, the path length to the ground tends to have a large effect on noise generation. Further, it is desirable that the ESR (equivalent series resistance) is low, because charge and discharge are repeated at the input-side capacitor Cin and the output-side capacitor Cout. When the selection or arrangement of the above-described electronic components is improper, the controller 90 may not be able to fully exhibit its performance.

Meanwhile, various kinds of semiconductor modules incorporating a plurality of semiconductor elements have conventionally been proposed. Such semiconductor elements may include a semiconductor element that generates a relatively large amount of heat (hereinafter referred to as "heating element"). Since the heat emitted by such a heating element may adversely affect on other semiconductor elements, some measures need to be taken. As an example of such measures, it has been proposed to dispose a heat conduction member between the heating element and a heat dissipation plate so that a heat transfer path is formed. For instance, JP-A-2004-87594 discloses a semiconductor module as shown in FIG. 27 of the present application. The semiconductor module X2 includes a substrate 92 on which a plurality of circuit components, including a heating element 91, are mounted. A heat dissipation plate 93 is attached to the substrate 92. The substrate 92 is formed with a wiring pattern 94 on the obverse surface. The heating element 91 is provided with a pair of external electrodes 91a and a ground electrode 91b. Each of the external electrodes 91a is connected to the wiring pattern 94. The ground electrode 91b is formed on the mounting surface of the heating element 91 and held in contact with a heat conduction member 95 filling the through-hole 92a of the substrate 92. The heat conduction member 95 projects from the lower end of the through-hole 92a to be in contact with the heat dissipation plate 93.

For instance, the semiconductor module X2 is made as follows. First, the substrate 92 and the heat dissipation plate 93 are bonded together, and cream solder is applied to the obverse surface of the substrate 92. Thereafter, the substrate 92 and the heat dissipation plate 93 are transferred into a reflow furnace and heated so that the cream solder is melt. In this process, part of the cream solder flows into the space between the substrate 92 and the heat dissipation plate 93 through the through-hole 92a, whereby the heat conduction member 95 as shown in FIG. 27 is formed.

The semiconductor module X2 has the following drawbacks. When the amount of cream solder applied to the substrate 92 is insufficient, the heat conduction member 95 is undesirably separated from the heat dissipation plate 93, so that heat transfer does not occur properly. Conversely, when the amount of cream solder is excessive, undesirable electrical connection may occur between the wirings provided on the reverse surface of the substrate 92.

SUMMARY OF THE INVENTION

The present invention has been proposed under the circumstances described above. It is therefore an object of the present invention to provide a DC voltage conversion module capable of properly performing voltage conversion without the need for external parts. Another object of the present invention is to provide a semiconductor module that allows heat generated from a semiconductor element to be efficiently transferred to a heat dissipation plate. Still another object of the present invention is to provide a method of making such a semiconductor module.

According to a first aspect of the present invention, there is provided a DC voltage conversion module comprising a substrate; an input terminal, an output terminal, a ground terminal; a DC voltage conversion control element mounted on the substrate; a coil mounted on the substrate and connected to the DC voltage conversion control element and the output terminal; an input-side capacitor mounted on the substrate and connected to the input terminal and the ground terminal; and an output-side capacitor mounted on the substrate and connected to the output terminal and the ground terminal. The input terminal, the output terminal, and the ground terminal project in a predetermined projecting direction parallel to each other. The ground terminal is arranged between the input terminal and the output terminal in a direction perpendicular to the projecting direction.

Preferably, the coil is interposed between the input, the output and the ground terminals and the DC voltage conversion control element in the projecting direction.

Preferably, in the direction perpendicular to the projecting direction, the output-side capacitor is aligned with the coil and positioned on the output terminal side.

Preferably, in the projecting direction, the input-side capacitor is adjacent to the output-side capacitor and arranged on an opposite side of the input, the output and the ground terminals.

Preferably, the DC voltage conversion module according to the present invention further comprises a fuse mounted on the substrate, connected to the input terminal and the DC voltage conversion control element, and arranged on the opposite side of the coil from the output-side capacitor in the direction perpendicular to the projecting direction.

Preferably, the substrate includes a base member having an obverse surface and a reverse surface, an obverse wiring pattern formed on the obverse surface of the base member, a reverse wiring pattern formed on the reverse surface of the base member, at least one through-hole penetrating the base member and overlapping the obverse and the reverse wiring patterns as viewed in a thickness direction of the base member, and a solder portion filling the through-hole.

Preferably, the DC voltage conversion control element, the coil, and the input-side and the output-side capacitors are mounted on the obverse surface of the substrate.

Preferably, the reverse wiring pattern includes a first block connected to the ground terminal and including a projecting portion projecting in the projecting direction to the opposite side of the input, the output and the ground terminals, and a second block having a U-shape surrounding the projecting portion.

Preferably, the first block is larger in area than the second block.

Preferably, the DC voltage conversion module further comprises a heat dissipation plate bonded to the reverse surface of the substrate.

Preferably, the through-hole is provided at a position overlapping the DC voltage conversion control element.

Preferably, the base member is formed with an additional through-hole, the obverse wiring pattern includes a block in which the DC voltage conversion control element is mounted, and the block includes a region located at a position that does not overlap the DC voltage conversion control element and formed with the additional through-hole.

According to a second aspect of the present invention, there is provided a semiconductor module comprising: a substrate including an obverse surface and a reverse surface and formed with at least one through-hole; a semiconductor element mounted on the obverse surface of the substrate; a heat dissipation plate arranged to face the reverse surface of the substrate; and a heat conduction member including a filling portion filling the through-hole and a bulging portion bulging to the reverse surface side of the substrate. The bulging portion has a thickness that reduces as proceeding away from the filling portion in an in-plane direction of the substrate, and is held in contact with the heat dissipation plate.

Preferably, the through-hole is provided at a position that overlaps the semiconductor element as viewed in the thickness direction of the substrate.

Preferably, the substrate includes a base member having an obverse surface and a reverse surface, a first obverse wiring pattern formed on the obverse surface of the base member, a first reverse wiring pattern formed on the reverse surface of the base member. The semiconductor element is mounted on the first obverse wiring pattern. The first reverse wiring pattern is electrically connected to the first obverse wiring pattern via the through-hole. The bulging portion is formed to cover at least part of the first reverse wiring pattern.

Preferably, the semiconductor module according to the second aspect of the present invention further comprises a second reverse wiring pattern formed on the reverse surface of the base member and spaced from the first reverse wiring pattern. The second reverse wiring pattern is insulated from the heat dissipation plate.

Preferably, the semiconductor module according to the second aspect of the present invention further comprises a second obverse wiring pattern formed on the obverse surface of the base member and spaced from the first obverse wiring pattern. The second obverse wiring pattern is electrically connected to the second reverse wiring pattern.

Preferably, the heat conduction member is made of solder material or resin.

Preferably, the semiconductor module according to the second aspect of the present invention further comprises an input terminal, an output terminal, a ground terminal, a coil, an input-side capacitor and an output-side capacitor. The semiconductor element is a DC voltage conversion control element. The coil is mounted on the substrate and connected to the DC voltage conversion control element and the output terminal. The input-side capacitor is mounted on the substrate and connected to the input terminal and the ground terminal. The output-side capacitor is mounted on the substrate and connected to the output terminal and the ground terminal.

Preferably, the input terminal, the output terminal and the ground terminal are parallel to each other and project in a same direction. In a direction perpendicular to the same direction, the ground terminal is arranged between the input terminal and the output terminal.

According to a third aspect of the present invention, there is provided a method of making a semiconductor module comprising the steps of: preparing a substrate including an obverse surface and a reverse surface and formed with at least one through-hole; mounting a semiconductor element on the obverse surface of the substrate; providing a heat dissipation plate for cooling the semiconductor element. The manufacturing method further comprises the step of forming a heat conduction member including a filling portion and a bulging portion on the substrate before the step of providing the heat dissipation plate. The filling portion is formed to fill the through-hole. The bulging portion is formed to bulge to the reverse surface side of the substrate and have a thickness that reduces as proceeding away from the filling portion in an in-plane direction of the substrate. The step of providing the heat dissipation plate comprises disposing the heat dissipation plate in contact with the bulging portion.

Preferably, the through-hole is provided at a position overlapping the semiconductor element as viewed in the thickness direction of the substrate.

Preferably, the substrate includes a base member having an obverse surface and a reverse surface, a first obverse wiring pattern formed on the obverse surface of the base member, a first reverse wiring pattern formed on the reverse surface of the base member. The semiconductor element is mounted on the first obverse wiring pattern. The first reverse wiring pattern includes a region that overlaps the first obverse wiring pattern as viewed in the thickness direction of the substrate. The through-hole is formed in a region that overlaps both the first obverse wiring pattern and the first reverse wiring pattern as viewed in the thickness direction of the base member. The step of forming the heat conduction member comprises forming the bulging portion such that the bulging portion covers at least part of the first reverse wiring pattern.

Preferably, the heat conduction member is made of solder material.

Preferably, the heat conduction member is made by flow soldering in which solder material in a liquid state supplied in a solder bath is caused to adhere to the reverse surface of the substrate.

Preferably, the heat conduction member is formed by reflow soldering in which solder paste applied to the substrate is heated.

Preferably, the heat conduction member is made of resin.

Other features and advantages of the present invention will become more apparent from the detailed description given below with reference to the accompanying drawings.

DETAILED DESCRIPTION OF THE PREFERRED EMBODIMENTS

Figure 1:
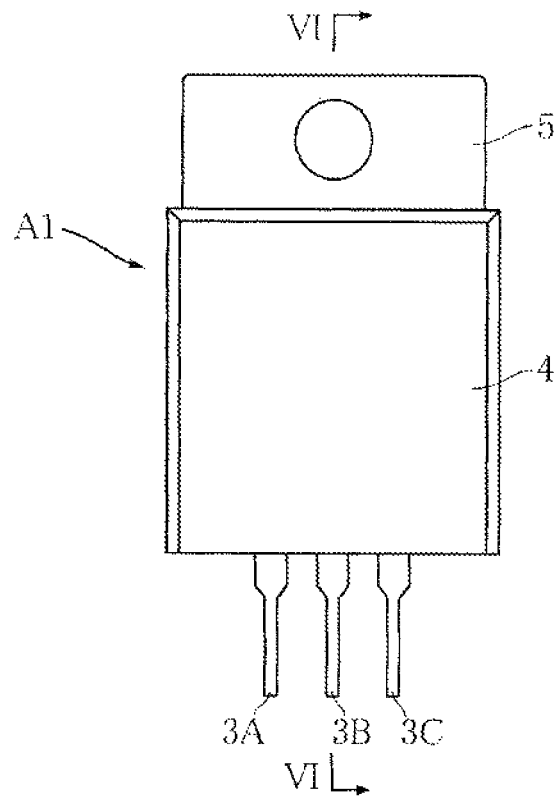
FIG. 1 is a front view of a DC voltage conversion module according to a first embodiment of the present invention.

Preferred embodiments of the present invention are described below with reference to the accompanying drawings.

FIGS. 1-10 show a DC voltage conversion module according to a first embodiment of the present invention. The illustrated DC voltage conversion module A1 is used for converting a received input voltage into a desired output voltage for supply to a device of an electronic apparatus. The DC voltage conversion module A1 includes a substrate 1, a plurality of electronic components 2, an input terminal 3A, a ground terminal 3B, an output terminal 3C, a resin package 4 and a heat dissipation plate 5. For easier understanding, the illustration of the resin package 4 and the heat dissipation plate 5 is omitted in FIG. 7. For instance, the DC voltage conversion module A1 is about 13.6 mm in width, about 20 mm in height (measured without including terminals 3A, 3B, 3C), and about 5.2 mm in thickness.

The substrate 1 supports the electronic components 2. As shown in FIG. 10, the substrate 1 includes a base member 11 made of e.g. glass-fiber-reinforced epoxy resin, an obverse wiring pattern 12 (see FIG. 8) formed on the obverse surface of the base member 11, and a reverse wiring pattern 13 (see FIG. 9) formed on the reverse surface of the base member. In this embodiment, the substrate 1 has a size of about 12.8 mm×13.5 mm in plan view, and a thickness of about 0.8 mm.

The substrate 1 is formed with a plurality of through-holes 15. As shown in FIG. 10, each of the through-holes 15 penetrates the base member 11 and reaches both of the obverse wiring pattern 12 and the reverse wiring pattern 13. The inner surface of each through-hole 15 is formed with a plating 16 connected to both of the obverse wiring pattern 12 and the reverse wiring pattern 13. Each through-hole 15 is filled with solder 17.

Figure 8:
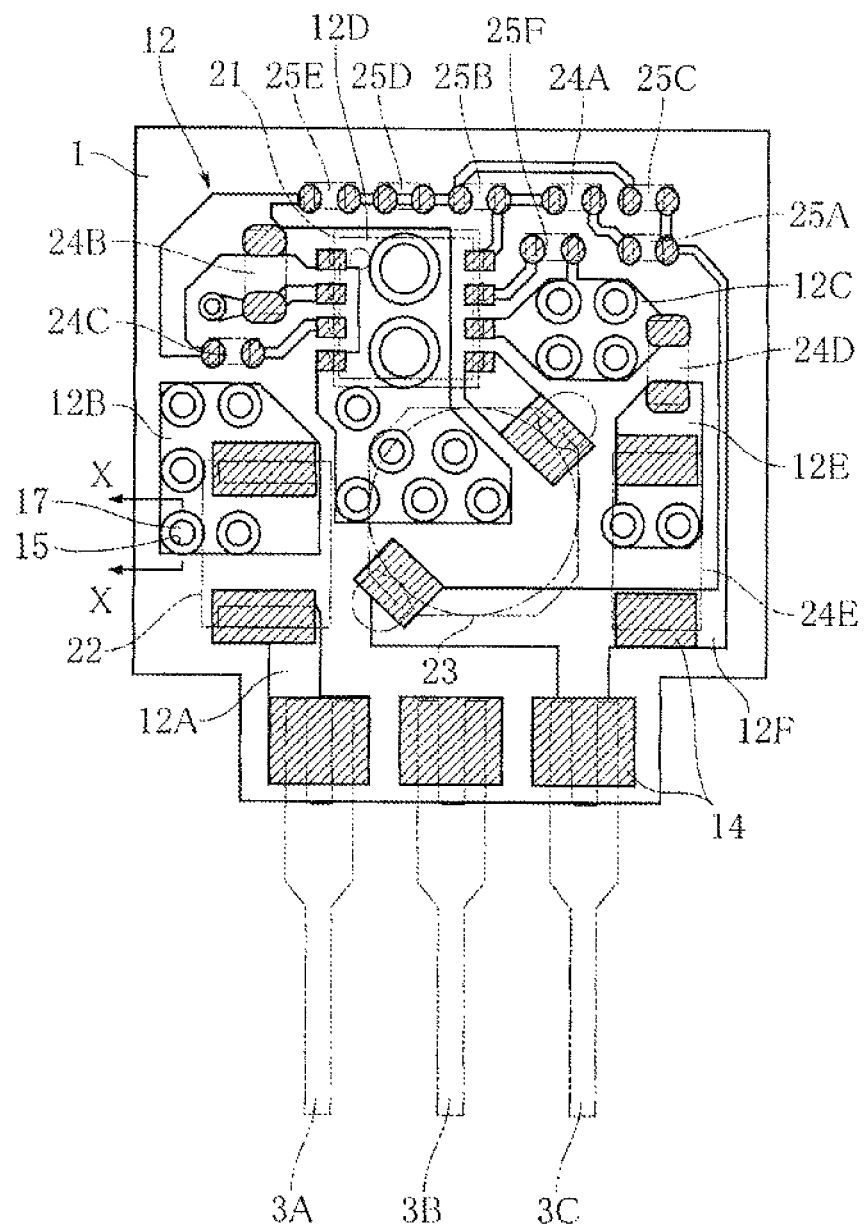
FIG. 8 is a front view showing a substrate used for the DC voltage conversion module.

As shown in FIG. 8, the obverse wiring pattern 12 includes blocks 12A, 12B, 12C, 12D, 12E, 12F. The obverse wiring pattern 12 is provided with a plurality of pads 14 for mounting the electronic components 2 at appropriate portions.

Figure 9:
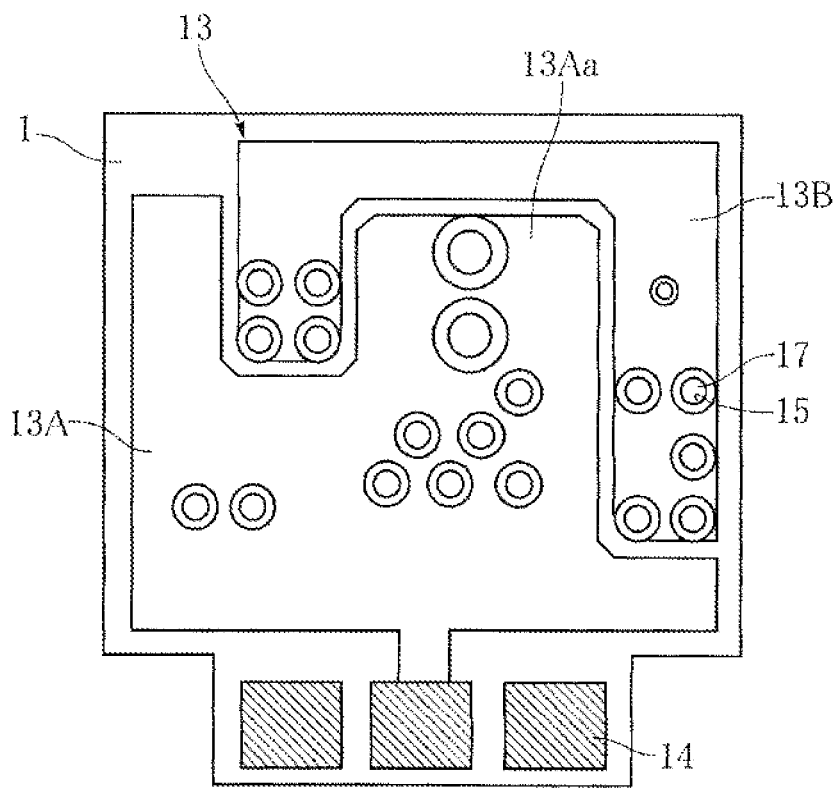
FIG. 9 is a back view of the substrate.
Figure 10:
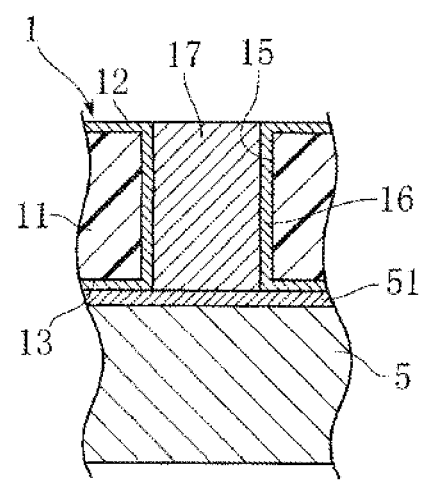
FIG. 10 is a sectional view taken along lines X-X in FIG. 8.

As shown in FIG. 9, the reverse wiring pattern 13 includes blocks 13A and 13B. The ground terminal 3B is connected to the block 13A so that the block functions as a ground pattern. The block 13A covers most part of the reverse surface of the substrate 1 adjacent to the input terminal 3A, the ground terminal 3B, and the output terminal 3C. The block 13A includes a projecting portion 13Aa. The projecting portion 13Aa projects to the opposite side of the input terminal 3A, the ground terminal 3B, and the output terminal 3C. The block 13B is U-shaped and arranged to fit to the projecting portion 13Aa of the block 13A.

Figure 6:
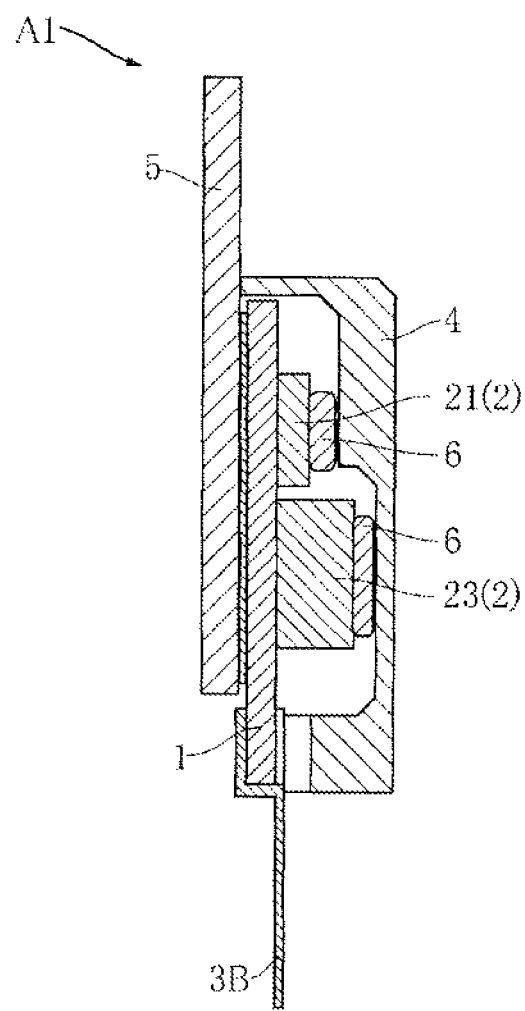
FIG. 6 is a sectional view taken along lines VI-VI in FIG. 1.
Figure 7:
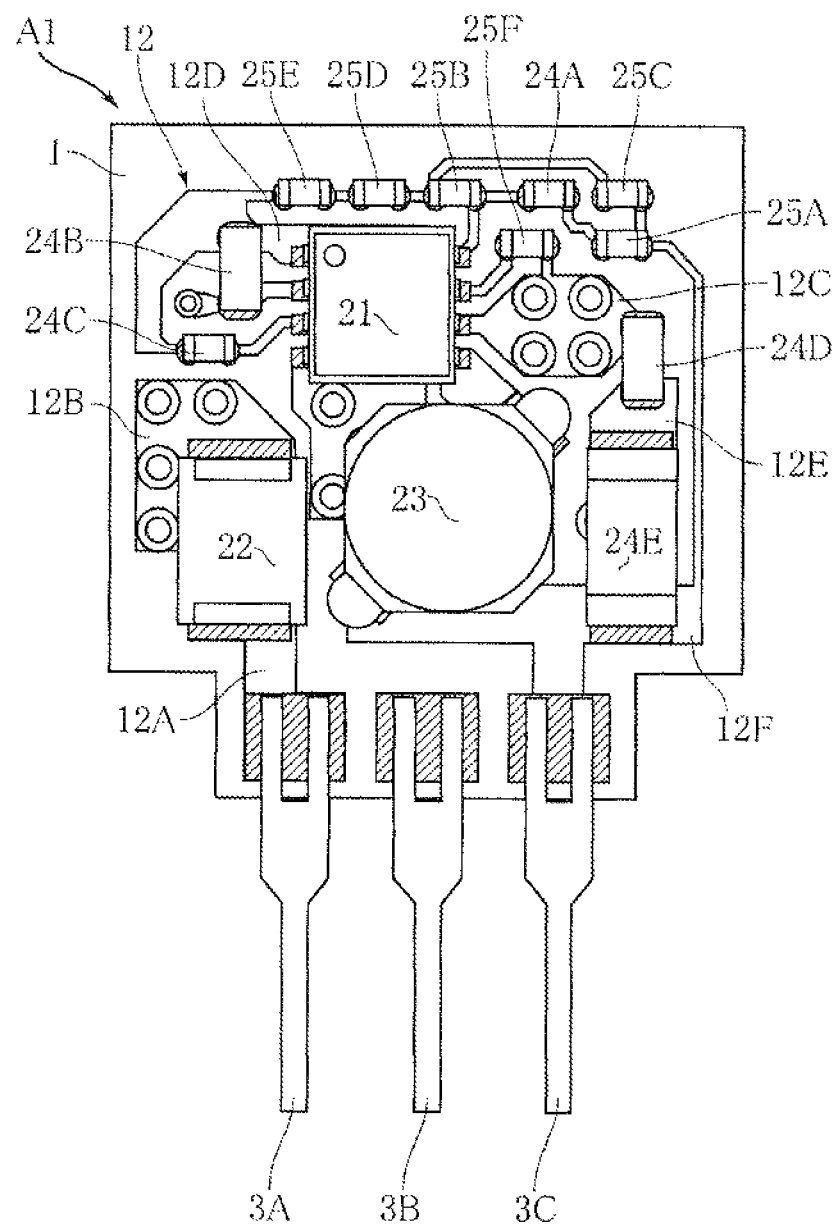
FIG. 7 is a front view showing a principal portion of the DC voltage conversion module.

The input terminal 3A, the ground terminal 3B, and the output terminal 3C are so-called pin-type terminals, and attached to the substrate 1, as shown in FIGS. 6 and 7. In this embodiment, as shown in FIGS. 1-7, the input terminal 3A, the ground terminal 3B and the output terminal 3C project in the same direction and are arranged parallel to each other. More specifically, as shown in FIG. 7, these terminals are arranged in the order of the input terminal 3A, the ground terminal 3B, and the output terminal 3C from the left. The input terminal 3A is connected to the block 12A. The output terminal 3C is connected to the block 12F. The ground terminal 3B is connected to the block 13A.

The electronic components 2 are provided for achieving the function of the DC voltage conversion module A1 and include an integrated circuit (IC) 21, a fuse 22, a coil 23, capacitors 24A-24E, and resistors 25A-25F, as shown in FIG. 7. The electronic components 2 are incorporated as shown in FIG. 11 to constitute a circuit that achieves the DC voltage conversion function.

The IC 21 is an example of DC voltage conversion control element and comprises a single-chip-type synchronous rectification step-down switching regulator incorporating an FET. The IC 21 is capable of reducing the input voltage (e.g. 5 V or 12 V) and outputting a relatively low voltage (e.g. 1.2 V, 1.8V, 3.3V, 5V). The IC 21 is mounted to overlap a portion of the block 12D that is close to the opposite side of the ground terminal 3B. The block 12D is formed with two through-holes 15 having a relatively large diameter at a portion overlapping the IC 21. Of the block 12D, the portion that does not overlap the IC 21 is formed with six through-holes 15 having a relatively small diameter.

Figure 11:
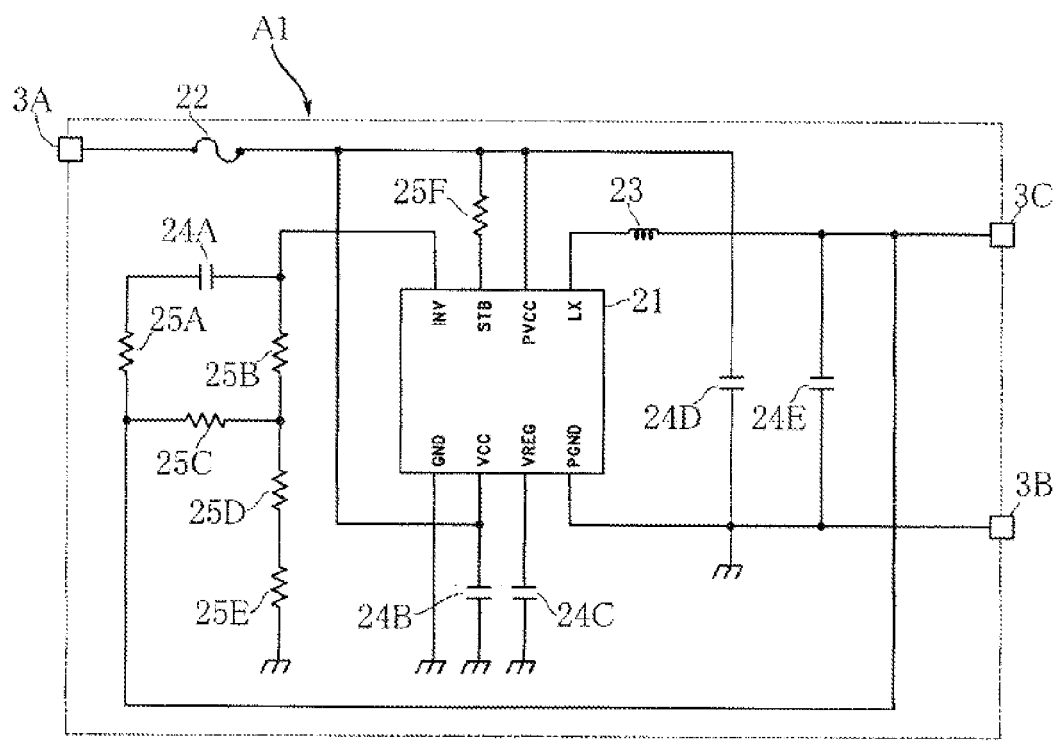
FIG. 11 is an equivalent circuit view of the DC voltage conversion module.

As shown in FIG. 11, the IC 21 has eight terminals. Specifically, the IC 21 has a ground terminal GND, a control unit power supply input terminal VCC, an internal circuit regulator 5V output terminal VREG, a power transistor ground terminal PGND, a coil connection terminal Lx, a DC/DC converter input terminal PVCC, an ON/OFF terminal STB, and an error amplifier input terminal INV.

The fuse 22 is provided for preventing the IC 21 from breaking due to overcurrent. The fuse 22 is located on the left side in FIG. 7 and mounted in such a manner as to bridge the block 12A and the block 12B. With this arrangement, the fuse 22 is electrically connected to the input terminal 3A.

The coil 23 is provided for smoothing the output voltage from the IC 21 and arranged between the IC 21 and the ground terminal 3B. The coil 23 is mounted in such a manner as to bridge the portion of the obverse wiring pattern 12 that is connected to the coil connection terminal of the IC 21 and the block 12F, and overlaps the portion of the block 12D that is close to the ground terminal 3B.

The capacitors 24A-24E are provided for smoothing the output voltage from the IC 21. Of these capacitors, the capacitor 24D functions as an input-side capacitor, whereas the capacitor 24E functions as an output-side capacitor. The capacitors 24A-24E are incorporated as shown in FIG. 7 and FIG. 11.

The capacitor 24E is arranged in such a manner as to bridge the block 12E and the block 12F and electrically connected to the output terminal 3C. The capacitor 24E is electrically connected also to the ground terminal 3B via the block 12E, the plating 16 of the through-hole 15 and the block 13A. The capacitor 24E is aligned with the coil 23 in a direction perpendicular to the projecting direction of the input terminal 3A, the ground terminal 3B and the output terminal 3C. In the example shown in FIG. 7, the capacitor 24E is positioned on the output terminal 3C side (i.e., the right side of the coil 23). In other words, the capacitor 24E is offset from the coil 23 in a direction from the central ground terminal 3B toward the output terminal 3C.

The capacitor 24D is arranged in such a manner as to bridge the block 12C and the block 12E. The capacitor 24D is positioned adjacent to the capacitor 24E in the projecting direction of the input terminal 3A, the ground terminal 3B and the output terminal 3C and on the opposite side of the capacitor 24E from the output terminal 3C. The capacitor 24D is electrically connected to the input terminal 3A via the block 12C, the plating 16 of the through-hole 15, the block 13B, the block 12B, the fuse 22 and the block 12A. The capacitor 24D is electrically connected also to the ground terminal 3B via the block 12E, the plating 16 of the through-hole 15 and the block 13A.

The resistors 25A-25F are the loads for balancing voltage conversion and incorporated as shown in FIG. 7 and FIG. 11.

The resin package 4 is provided for protecting the electronic components 2 and made of e.g. a black epoxy resin. As shown in FIGS. 1, 3, 4 and 5, the resin package 4 occupies most part of the front of the DC voltage conversion module A1 and extends onto the sides. As shown in FIG. 6, the resin package 4 includes a hollow portion, in which the electronic components 2 are accommodated. Silicone resin 6 is provided between the resin package 4 and the electronic components 2.

The heat dissipation plate 5 is made of e.g. aluminum and attached to the reverse surface of the substrate 1, as shown in FIG. 6. The bonding of the heat dissipation plate 5 and the substrate 1 is achieved by an adhesive having high heat conductivity. As shown in FIGS. 1-4, the heat dissipation plate 5 projects from the resin package 4 in the opposite direction from the input terminal 3A, the ground terminal 3B and the output terminal 3C.

Figure 2:
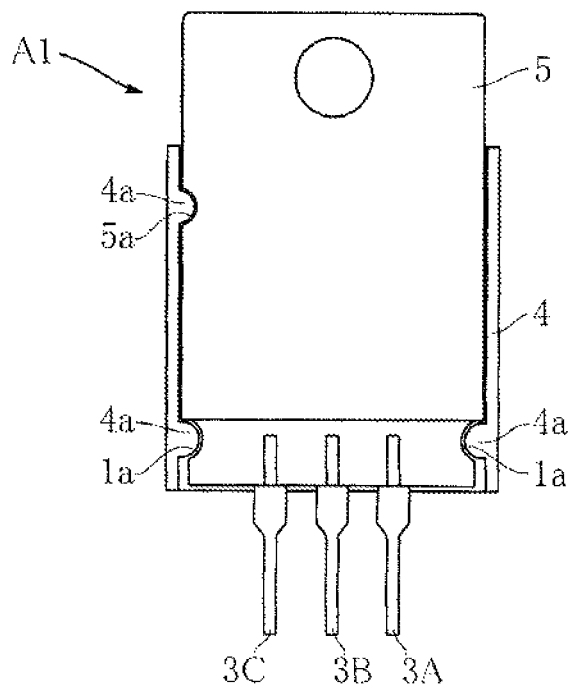
FIG. 2 is a rear view of the DC voltage conversion module.
Figure 3:
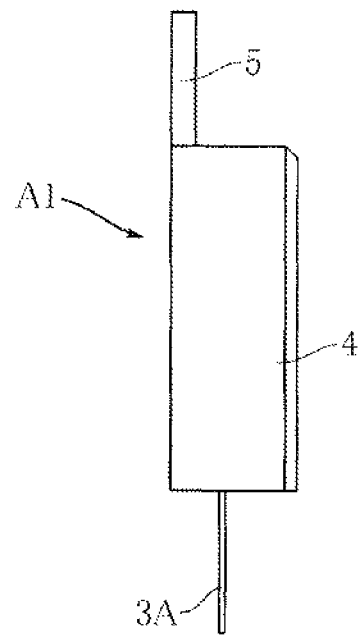
FIG. 3 is a left side view of the DC voltage conversion module.
Figure 4:
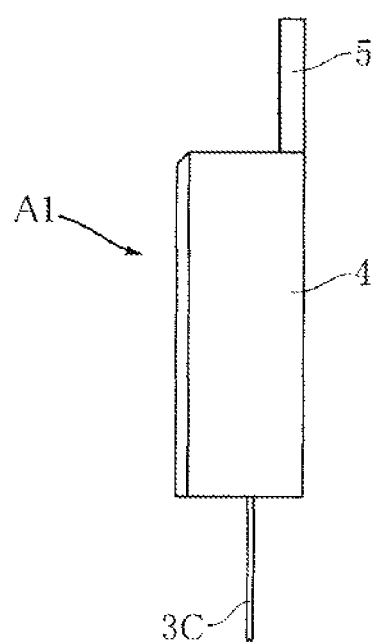
FIG. 4 is a right side view of the DC voltage conversion module.
Figure 5:
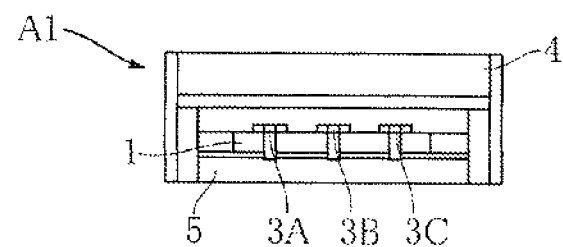
FIG. 5 is a bottom view of the DC voltage conversion module.

As shown in FIG. 2, the resin package 4 is formed with three projections 4a. The projection 4a on the right side is fitted in a recess 1a of the substrate 1 at a position that does not overlap the heat dissipation plate 5. The two projections 4a on the left side are fitted in another recess 1a of the substrate 1 and a recess 5a of the heat dissipation plate 5, respectively.

An example of specification of the DC voltage conversion module A1 is as follows: As to the input voltage, the rating is 12 V, the minimum is 6V and the maximum is 14V. As to the output voltage, the rating is 5.00 V, the minimum is 4.90 V, and the maximum is 5.10 V. The maximum output current is 500 mA, and is 800 mA when a heat sink is used. As to the line regulation, the rating is 5 mV and the maximum is 50 mV. As to the load regulation, the rating is 10 mV and the maximum is 50 mV. As to the output ripple voltage, the rating is 5 mV, and the maximum is 50 mV. As to the minimum start-up time, the rating is 7.0 msec. and the minimum is 4.0 msec. As to the power conversion efficiency, the rating is 88%, and the minimum is 83%.

The advantages of the DC voltage conversion module A1 are described below.

According to the above-described structure, the DC voltage conversion module A1 is integrally provided with, not only the IC 21, but also other electronic components 2 such as the coil 34, the input-side capacitor 24D and the output-side capacitor 24E as mounted on the common substrate 1. These electronic components 2 are properly selected by a person having much knowledge of the characteristics of the IC 21 such that the required voltage conversion specification is satisfied. Thus, the user of the DC voltage conversion module A1 does not need to select a coil or a capacitor, but only needs to connect the three terminals, i.e., the input terminal 3A, the ground terminal 3B and the output terminal 3C to a circuit to be constituted. This allows proper DC voltage conversion sufficiently utilizing the function of the IC 21.

The arrangement of the input terminal 3A, the ground terminal 3B and the output terminal 3C is the same as that in a typical LDO regulator (linear voltage regulator) widely used as a DC voltage conversion means. Thus, in using the DC voltage conversion module A1 instead of a conventional LDO regulator, the design of the circuit board does not need to be changed, which is advantageous.

The electronic components 2 other than the IC 21 should be arranged in a path connecting the IC 21 and each of the terminals 3A, 3B and 3C. Placing the IC 21 as far as possible or at a farthest position from each of the terminals 3A, 3B and 3C allows other electronic components 2 to be arranged properly. Since the coil 23 is a relatively large electronic component, it is reasonable to arrange the coil between the IC 21 and each terminal 3A, 3B, 3C.

By arranging the output-side capacitor 24E in alignment with the coil 23 and on the output terminal 3C side, the length of the path from the coil 23 to the output terminal 3C is shortened. This contributes to suppression of noise generation. The alignment of the input-side capacitor 24D and the output-side capacitor 24E achieves compact arrangement. Electrically connecting the input-side capacitor 24D with the input terminal 3A and the ground terminal 3B via blocks 13A and 13B having a relatively large area allows the length of the path between these members to be shortened. Shortening the path length is suitable for reducing the ESR involving the capacitors 24D and 24E.

Arranging the fuse 22, which is a relatively large electronic component, on the opposite side of the coil 23 from the output-side capacitor 24 achieves more compact arrangement.

The through-holes 15 filled with solder 17 promotes heat transfer from the obverse surface to the reverse surface of the substrate 1 while electrically connecting the obverse wiring pattern 12 and the reverse wiring pattern 13. Arranging the through-holes 15 having a relatively large diameter so as to overlap the IC 21, whose heat generation amount is largest, ensures that heat from the IC 21 is efficiently dissipated to the reverse surface. The provision of the through-holes 15 also at a portion of the block 12D that does not overlap the IC 21 further promotes the heat dissipation from the IC 21. The diameter of these through-holes 15 is smaller than that of the through-holes overlapping the IC 21. The through-holes 15 with a larger diameter are suitable for directly receiving the heat from the IC 21 at the solder 17 filled in the though-holes, whereas the through-holes 15 with a smaller diameter are suitable for increasing the area that transfers the heat, conducted through the block 12D, to the solder 17.

The provision of the heat dissipation plate 5 on the reverse surface of the substrate 1 allows the heat conducted to the solder 17 of the through-holes 15 to be dissipated efficiently.

The structure of the reverse wiring pattern 13 including the blocks 13A and 13B arranged to fit to each other is suitable for achieving compact arrangement of the electronic components around the coil 23. Since the block 13A as a ground pattern covers most part of the reverse surface of the substrate 1, shielding effect which prevents noise leakage enhances. The heat dissipation effect is further promoted by making the block 13A large.

The block 12D connected to ground is arranged at the center of the obverse surface of the substrate 1. This prevents noise generated from the IC 21 and so on from leaking to the reverse surface side. Arranging the IC 21, whose heat generation amount is largest, close to the center of the heat dissipation plate 5 is favorable to the enhancement of heat dissipation efficiency.

As shown in FIG. 2, the two recesses 1a provided at a lower portion are arranged so as not to overlap the heat dissipation plate 5. This arrangement makes it easy to check whether or not there is positional deviation between the substrate 1 and the resin package 4. Eliminating positional deviation is favorable to proper heat dissipation and noise blocking. The heat dissipation plate 5 is formed with a single recess 5a, and the projection 4a is fitted into this recess 5a only. Thus, unfavorable reduction of the exposed area of the heat dissipation plate 5 is avoided, so that heat dissipation effect is secured.

The DC voltage conversion module of the present invention is not limited to the foregoing embodiment. The specific structure of each part of the DC voltage conversion module can be varied in design in many ways.

FIGS. 12-17 show a semiconductor module according to a second embodiment of the present invention. The illustrated semiconductor module A2 includes a substrate 1', a plurality of electronic components 2', an input terminal 3A', a ground terminal 3B', an output terminal 3C', a resin package 4' and a heat dissipation plate 5'. The semiconductor module A2 is a switching regulator for converting the received input voltage into a desired output voltage, but the present invention is not limited to this. For instance, the semiconductor module A2 is about 13.6 mm in width, about 20 mm in height (measured without including terminals 3A', 3B', 3C'), and about 5.2 mm in thickness. It is to be noted that the width direction of the semiconductor module A2 is defined as x direction, the height direction as y direction, and the thickness direction as z direction.

The substrate 1' supports the electronic components 2' and comprises a printed board obtained by printing wirings on a base member 11' made of e.g. glass-fiber-reinforced epoxy resin. The base member is formed with an obverse wiring pattern 12' (see FIG. 15) on the obverse surface and a reverse wiring pattern 13' (see FIG. 16) on the reverse surface. In this embodiment, the base material 1' has a size of about 12.8 mm×13.5 mm in plan view, and a thickness of about 0.8 mm.

Figure 17:
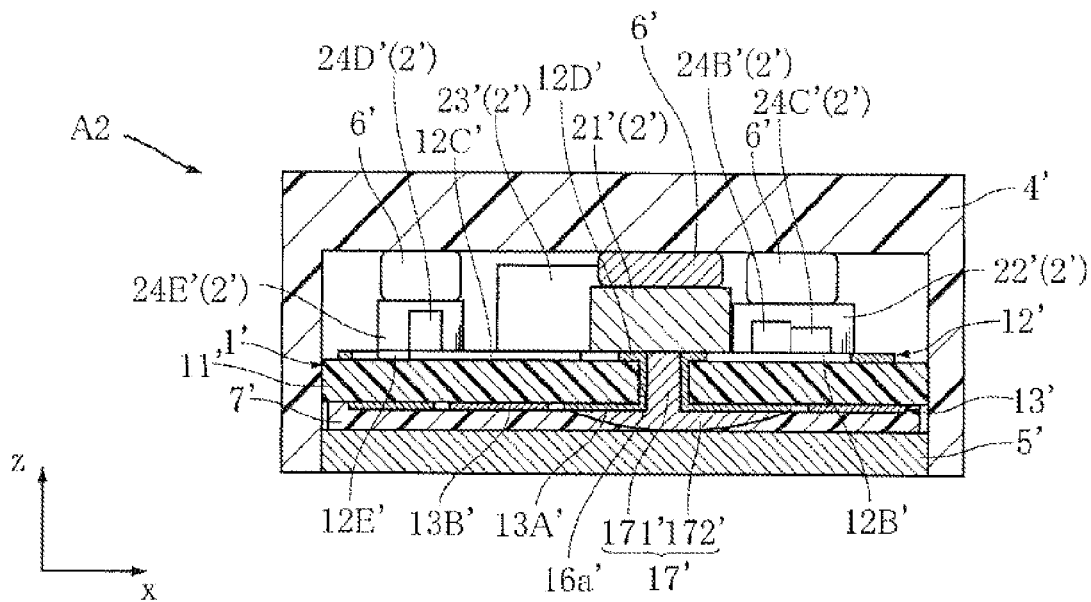
FIG. 17 is a sectional view taken along lines XVII-XVII in FIG. 12.

The base member' (substrate 1') is formed with a plurality of through-holes 15', and through-holes 16a', 16b', 16c'. Each of the through-holes 15' penetrates the base member 11' in z direction and reaches both of the obverse wiring pattern 12' and the reverse wiring pattern 13'. The inner surface of each through-hole 15' is formed with a plating of e.g. copper connected to both of the obverse wiring pattern 12' and the reverse wiring pattern 13'. As shown in FIG. 17, the through-holes 16a', 16b', 16c' penetrate the base member 11' in z direction and reach both of the obverse wiring pattern 12' and the reverse wiring pattern 13'. The inner surface of each through-hole 16a', 16b', 16c' is formed with a plating of e.g. copper connected to both of the obverse wiring pattern 12' and the reverse wiring pattern 13'. Each through-hole 16a', 16b', 16c' is filled with a heat conductive member 17'. In this embodiment, the radius of the through-holes 16a', 16b' is about 1.0 mm, whereas the radius of the through-holes 15', 16c' is 0.3 to 0.5 mm.

Figure 14:
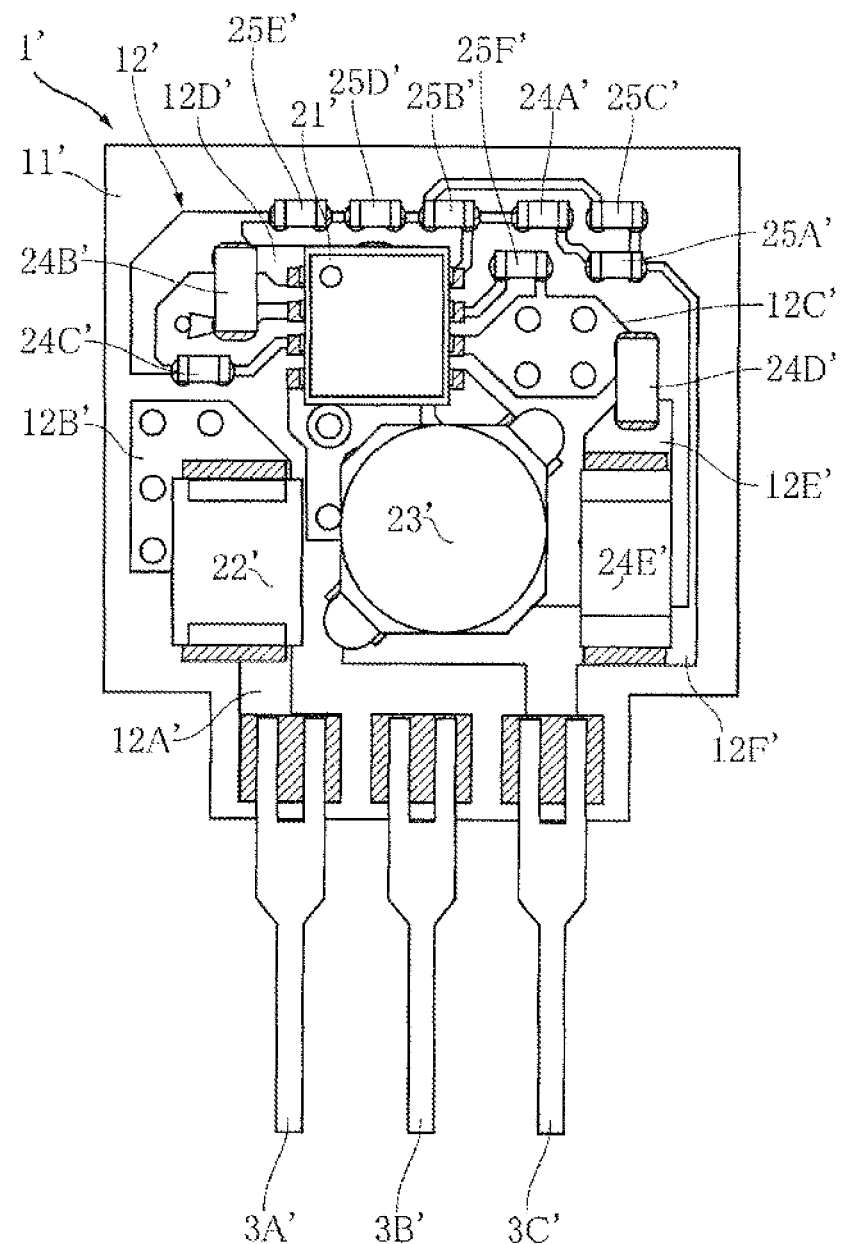
FIG. 14 shows the obverse surface side of a substrate incorporated in the semiconductor module of FIG. 12.
Figure 15:
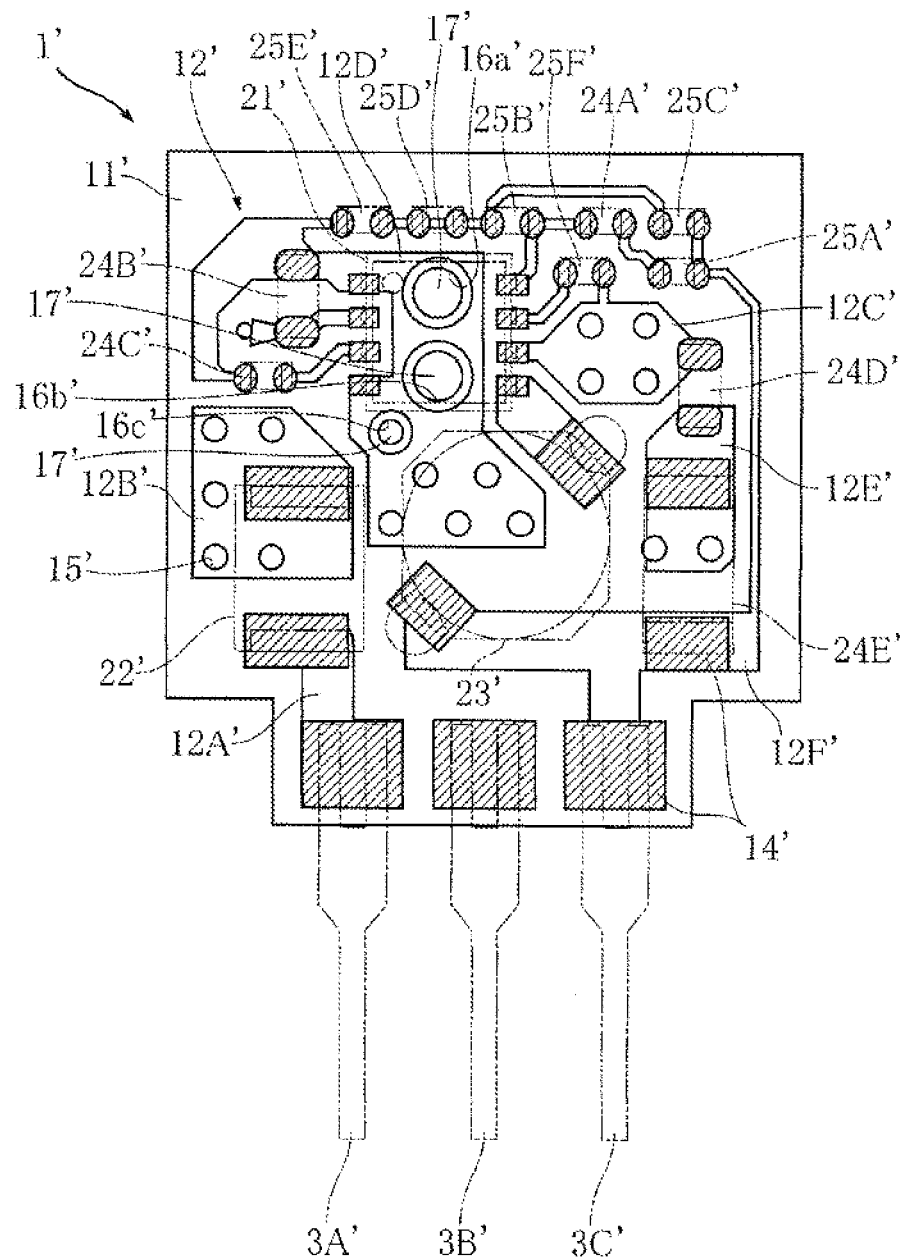
FIG. 15 is a view showing the obverse surface side of the substrate, in which some parts are indicated by phantom lines.
Figure 15:
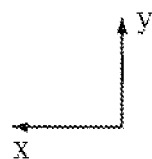
Figure 16:
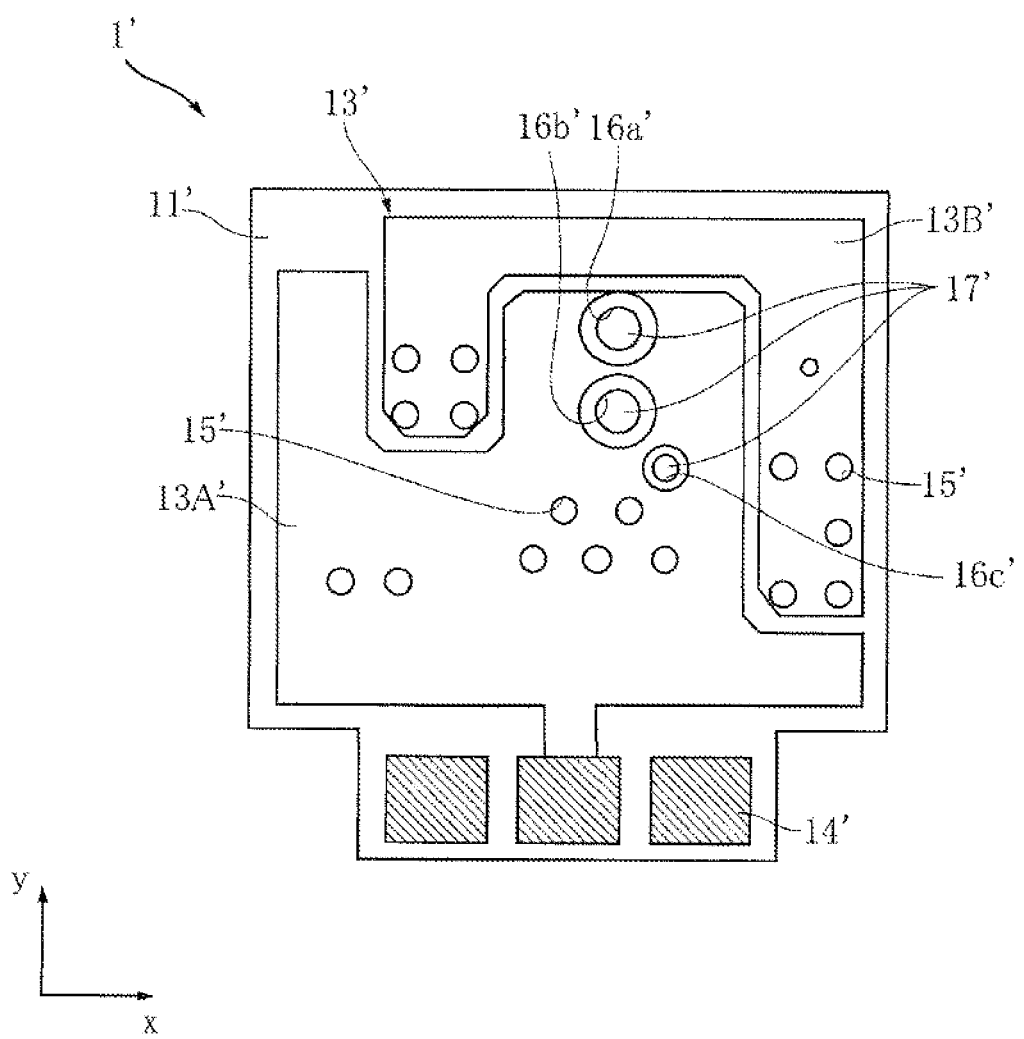
FIG. 16 shows the reverse surface side of the substrate.

As shown in FIG. 15, the obverse wiring pattern 12' includes blocks 12A', 12B', 12C', 12D', 12E', 12F' spaced from each other. The obverse wiring pattern 12' is provided with a plurality of pads 14' for mounting the electronic components 2' at appropriate portions. In FIGS. 14-16, the block 12D' corresponds to the first obverse wiring pattern of the present invention, whereas the blocks 12A', 12B', 12C', 12E', 12F' correspond to the second obverse wiring pattern of the present invention.

As shown in FIG. 16, the reverse wiring pattern 13' includes blocks 13A' and 13B' spaced from each other. The ground terminal 3B' is connected to the block 13A' so that the block functions as a ground pattern. The block 13A' covers most part of the reverse surface of the substrate 1' adjacent to the input terminal 3A', the ground terminal 3B', and the output terminal 3C'. The block 13A' includes a projecting portion. The projecting portion projects to the opposite side of the input terminal 3A', the ground terminal 3B', and the output terminal 3C'. The block 13B' is U-shaped and arranged to fit to the projecting portion of the block 13A'. The block 13B' corresponds to the second reverse wiring pattern.

The obverse wiring pattern 12' and the reverse wiring pattern 13' are made of e.g. copper and formed to have a thickness of about 50 μm.

Each of the three heat conduction members 17' comprises a filling portion 171' filling the interior of the through-hole 16a', 16b', 16c' and a bulging portion 172' bulging to the reverse surface side of the base member 11'. The heat conduction member 17' is made of a solder material containing copper. As shown in FIG. 17, the bulging portion 172' is formed into a dome shape (projecting toward the heat dissipation plate 5') whose thickness in z direction reduces as proceeding away from the filling portion 171' in x direction. The bulging portion 172' covers part of the block 13A' of the reverse wiring pattern 13'. The thickness in z direction of each bulging portion 172' connected to the filling portion 171' filling each through-hole 16a', 16b', 16c' is 0.2 mm. The thickness of each bulging portion 172' is determined in accordance with the specification of the semiconductor module A2, which will be described later, such that a proper distance is defined between the substrate 1' and the heat dissipation plate 5' to enhance insulation tolerability. For instance, when the voltages to be inputted to and outputted from the semiconductor module A2 are changed, the thickness of the bulging portions 172' is preferably adjusted appropriately.

The input terminal 3A', the ground terminal 3B', and the output terminal 3C' are pin-type terminals and attached to the substrate 1', as shown in FIGS. 14 and 15. In this embodiment, as shown in FIGS. 12-15, the input terminal 3A', the ground terminal 3B' and the output terminal 3C' project with the same orientation in direction y and are arranged parallel to each other. As shown in FIG. 14, these terminals are arranged in the order of the input terminal 3A', the ground terminal 3B', and the output terminal 3C' from the left in the figure. The input terminal 3A' is connected to the block 12A'. The output terminal 3C' is connected to the block 12F'. The ground terminal 3B' is connected to the block 13A'.

The electronic components 2' are provided for achieving the function of the semiconductor module A2 and include an integrated circuit (IC) 21', a fuse 22', a coil 23', capacitors 24A'-24E', and resistors 25A'-25F', as shown in FIG. 14. The electronic components' 2 are incorporated as shown in FIG. 14 to constitute a circuit that achieves the DC voltage conversion function.

The IC 21' is an example of semiconductor element and comprises a single-chip-type synchronous rectification step-down switching regulator incorporating an FET. The IC 21' is capable of reducing the input voltage (e.g. 5 V or 12 V) and outputting a relatively low voltage (e.g. 1.2 V, 1.8 V, 3.3 V, 5 V). The IC 21' is mounted to overlap a portion of the block 12D' that is close to the opposite side of the ground terminal 3B'. The block 12D' is formed with the through-holes 16a' and 16b' at a portion overlapping the IC 21' as viewed in z direction. Of the block 12D', the portion that does not overlap the IC 21' is formed with five through-holes 15' and the through-hole 16c'. The IC 21' includes eight terminals, each of which is connected to the obverse wiring pattern 12'.

The lower surface of the IC 21' in z direction is held in contact with the filling portion 171' of each of the through-holes 16a' and 16b'.

The fuse 22' is provided for preventing the IC 21' from breaking due to overcurrent. The fuse 22' is located on the left side in FIG. 14 and mounted in such a manner as to bridge the block 12A' and the block 12B'. With this arrangement, the fuse 22' is electrically connected to the input terminal 3A'.

The coil 23' is provided for smoothing the output voltage from the IC 21' and arranged between the IC 21' and the ground terminal 3B'. The coil 23' is mounted in such a manner as to bridge the portion of the obverse wiring pattern 12' that is connected to the coil connection terminal of the IC 21' and the block 12F', and overlaps the portion of the block 12D' that is close to the ground terminal 3B'.

The capacitors 24A'-24E' are provided for smoothing the output voltage from the IC 21'. Of these capacitors, the capacitor 24D' functions as an input-side capacitor, whereas the capacitor 24E' functions as an output-side capacitor. The capacitors 24A'-24E' are incorporated as, shown in FIG. 14.

The capacitor 24E' is arranged in such a manner as to bridge the block 12E' and the block 12F' and electrically connected to the output terminal 3C'. The capacitor 24E' is electrically connected also to the ground terminal 3B' via the block 12E', the plating of the through-hole 15' and the block 13A'. The capacitor 24E' is aligned with the coil 23' in a direction perpendicular to the projecting direction of each terminal 3A', 3B', 3C'. In the example shown in FIG. 14, the capacitor 24E' is positioned on the output terminal 3C' side (i.e., the right side of the coil 23'). In other words, the capacitor 24E' is offset from the coil 23' in a direction from the central ground terminal 3B' toward the output terminal 3C'.

The capacitor 24D' is arranged in such a manner as to bridge the block 12C' and the block 12E'. The capacitor 24D' is adjacent to the capacitor 24E' in the projecting direction of each terminal 3A', 3B', 3C' and on the opposite side of the capacitor 24E' from the output terminal 3C'. The capacitor 24D' is electrically connected to the input terminal 3A' via the block 12C', the plating of the through-hole 15', the block 13B', the block 12B', the fuse 22' and the block 12A'. The capacitor 24D' is electrically connected also to the ground terminal 3B' via the block 12E', the plating of the through-hole 15' and the block 13A'.

The resistors 25A'-25F' are the loads for balancing voltage conversion and incorporated as shown in FIG. 14.

Of these electronic components 2', the one whose heat generation amount is relatively large is the IC 21'.

Figure 12:
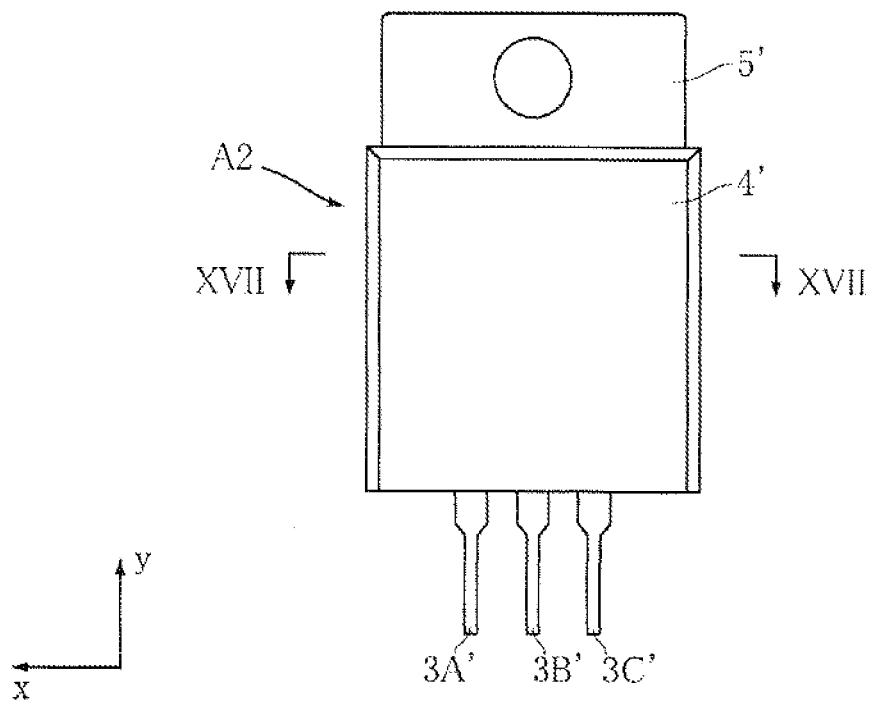
FIG. 12 is a front view of a semiconductor module according to a second embodiment of the present invention.

The resin package 4' is provided for protecting the electronic components 2' and made of e.g. a black epoxy resin. As shown in FIG. 12, the resin package 4' occupies most part of the front of the semiconductor module A2 and extends onto the sides. The resin package 4' includes a hollow portion, in which the electronic components 2' are accommodated. Silicone resin 6' is provided between the resin package 4' and the electronic components 2'.

Figure 13:
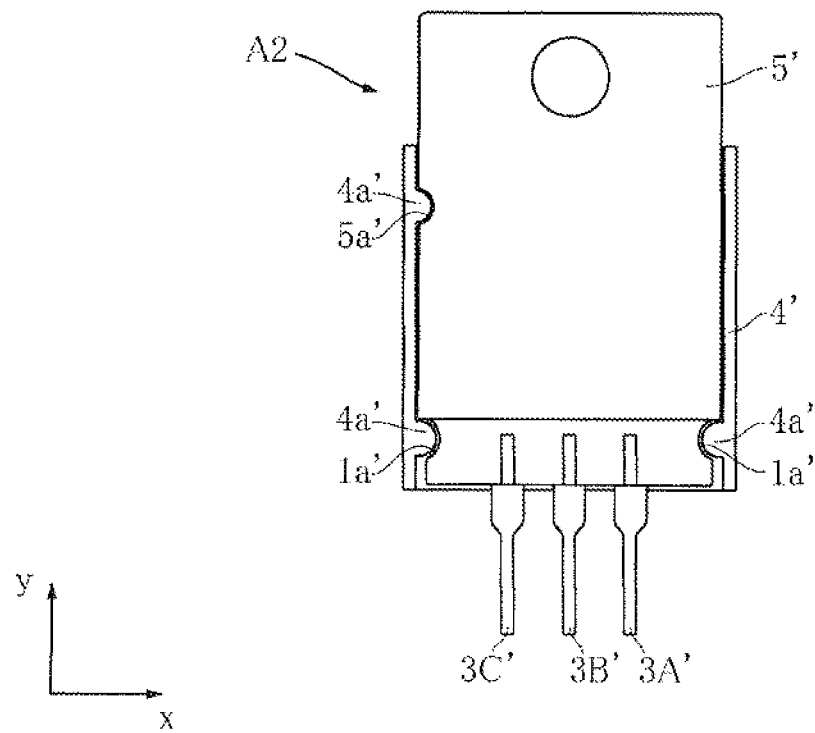
FIG. 13 is a back view of the semiconductor module shown in FIG. 12.

The heat dissipation plate 5' is made of e.g. aluminum and arranged to face the reverse surface of the substrate 1', as shown in FIG. 17. In this embodiment, the heat dissipation plate 5' and the substrate 1' are bonded together with an adhesive 7' having high heat conductivity. As shown in FIGS. 12 and 13, the heat dissipation plate 5' projects from the resin package 4' in y direction to the opposite side of the terminals 3A', 3B', 3C'.

As shown in FIG. 13, the resin package 4' is formed with three projections 4a'. The projection 4a' on the right side is fitted in a recess 1a' of the substrate 1' at a position that does not overlap the heat dissipation plate 5'. The two projections 4a' on the left side are fitted in another recess 1a' of the substrate 1' and a recess 5a' of the heat dissipation plate 5', respectively.

An example of specification of the semiconductor module A2 is as follows: As to the input voltage, the rating is 12 V, the minimum is 6 V and the maximum is 14V. As to the output voltage, the rating is 5.00 V, the minimum is 4.90 V, and the maximum is 5.10 V. The maximum output current is 500 mA, and is 800 mA when a heat sink is used. As to the line regulation, the rating is 5 mV and the maximum is 50 mV. As to the load regulation, the rating is 10 mV and the maximum is 50 mV. As to the output ripple voltage, the rating is 5 mV, and the maximum is 50 mV. As to the minimum start-up time, the rating is 7.0 msec. and the minimum is 4.0 msec. As to the power conversion efficiency, the rating is 88%, and the minimum is 83%.

An example of a method of making a semiconductor module A2 is described below with reference to FIGS. 18-22.

Figure 18:
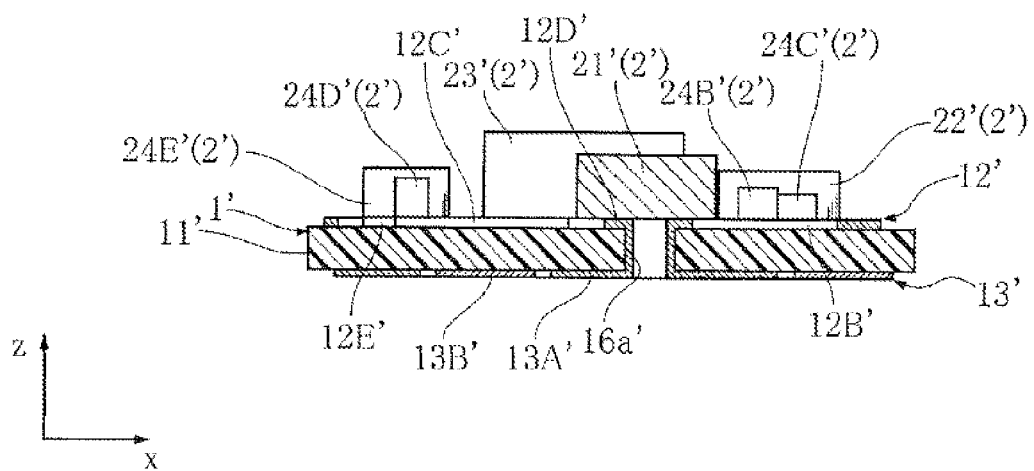
FIG. 18 is a sectional view showing a step of a method for making the semiconductor module shown in FIG. 12.

First, as shown in FIG. 18, a step of mounting a plurality of electronic components 2' on a substrate 1' is performed. In this step, through-holes 15', 16a', 16b', 16c' are formed in the base member 11', and an obverse wiring pattern 12' and a reverse wiring pattern 13' are formed. Thereafter, the electronic components 2' are mounted on the obverse wiring pattern 12'.

Figure 19:
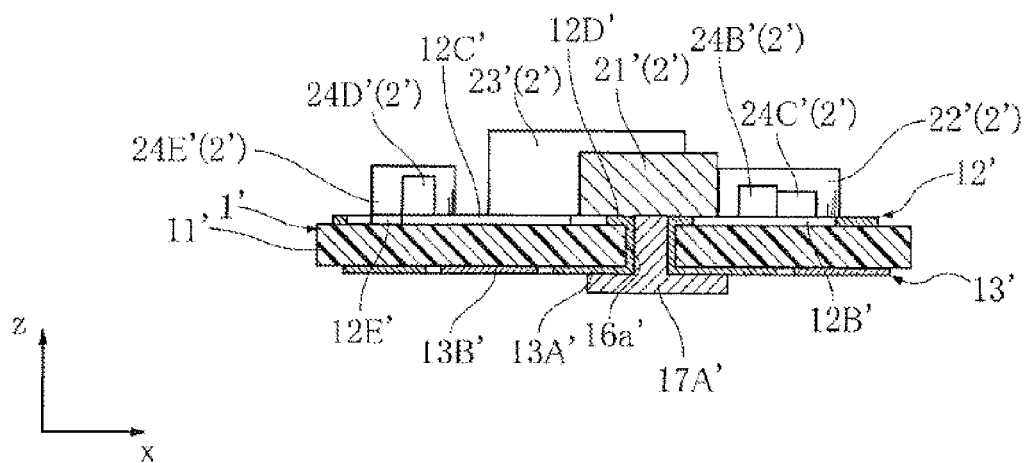
FIG. 19 is a sectional view showing a step subsequent to FIG. 18.
Figure 20:
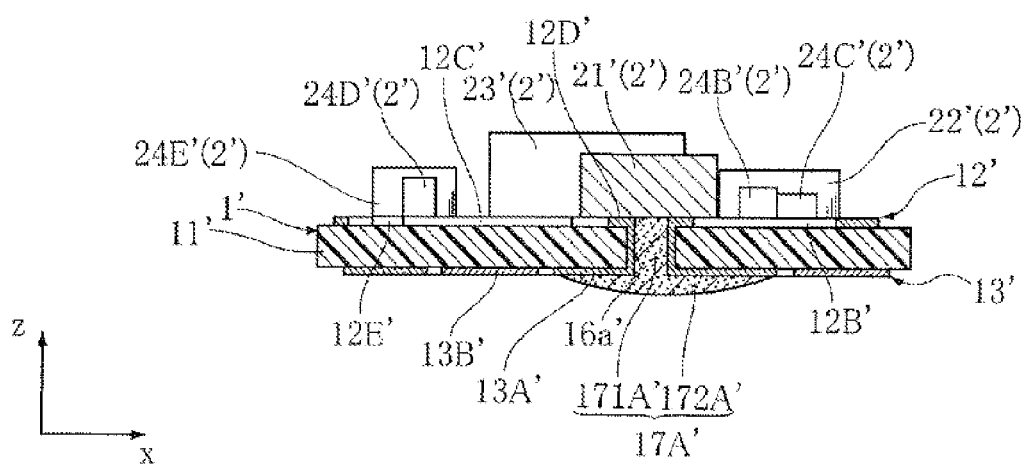
FIG. 20 is a sectional view showing a step subsequent to FIG. 19.

Then, as shown in FIGS. 19 and 20, a step of forming a heat conductive member 17' is performed. First, as shown in FIG. 19, solder paste 17A' is applied from the reverse surface side of the substrate 1' to a position overlapping each of the through-holes 16a', 16b', 16c'. In this step, each through-hole is filled with the solder paste. This step can be performed by using e.g. a solder printer. Then, the substrate 1' is put into a reflow furnace and heated to melt the solder paste 17A'. As shown in FIG. 20, the molten solder paste 17A' includes a filling portion 171A' filling the through-hole 16a', 16b', 16c' and a bulging portion 172A' formed into a dome shape due to surface tension. Since the base member 11' repels solder, the bulging portion 172A' of the molten solder paste 17A' spreads only to the area where the block 13A' is formed. By subsequently performing cooling, the heat conduction member 17' including the filling portion 171' and the bulging portion 172' is formed.

Figure 21:
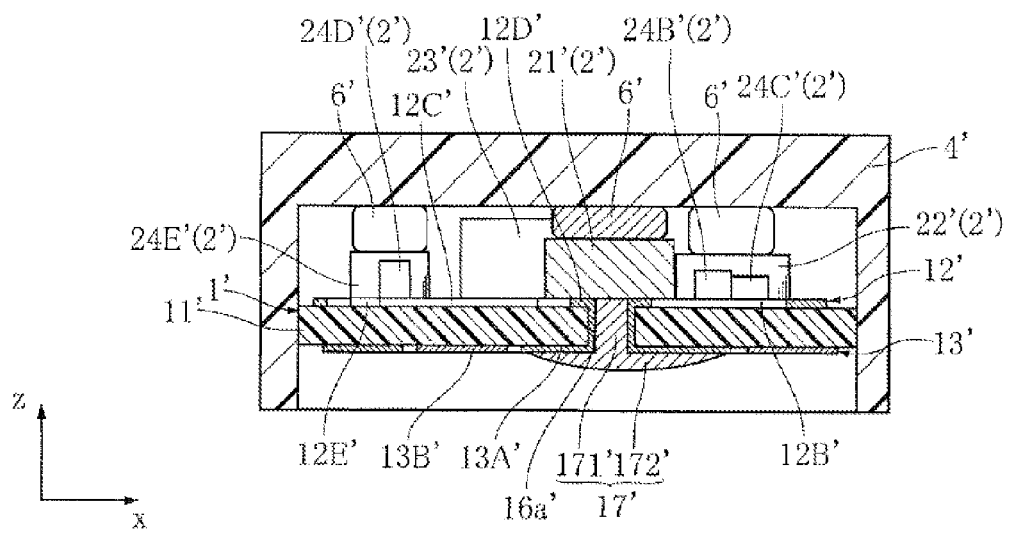
FIG. 21 is a sectional view showing a step subsequent to FIG. 20.

Then, as shown in FIG. 21, a step of fixing the substrate 1' into the resin package 4' is performed. Silicone resin 6' is also formed in this step.

Figure 22:
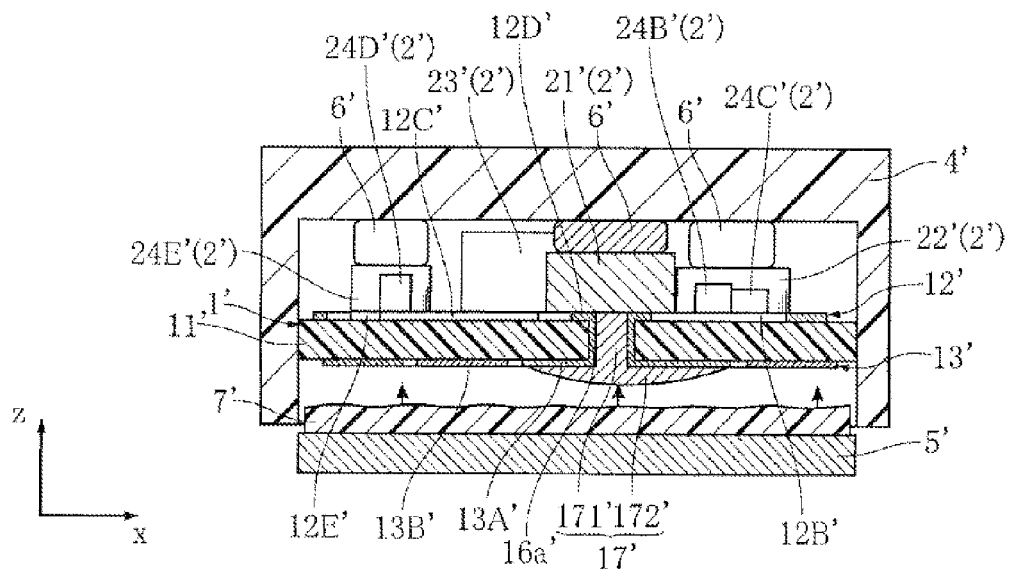
FIG. 22 is a sectional view showing a step subsequent to FIG. 21.

Then, as shown in FIG. 22, a step of attaching a heat dissipation plate 5' is performed. For instance, in this step, with an adhesive 7' applied to the surface of the heat dissipation plate 5' that faces the reverse surface of the substrate 1', the heat dissipation plate 5' is moved toward the reverse surface of the substrate 1', and the heat dissipation plate 5' and the substrate 1' are fixed at a position where the heat dissipation plate 5' comes into contact with the bulging portion 172'.

The semiconductor module A2 is smoothly made by the above-described steps.

According to this embodiment, the heat dissipation plate 5' is disposed in contact with the bulging portion 172' after the heat conduction member 17' is formed. Thus, the heat conduction member 17' and the heat dissipation plate 5' reliably come into contact with each other. The filling portion 171' filling the through-hole 16a', 16b' is in contact with the IC 21', so that the heat generated at the IC 21' is efficiently transferred to the heat dissipation plate 5' through the heat conduction member 17'. Thus, in the semiconductor module A2, heat generation at the IC 21', whose heat generation amount is relatively large, is quickly cooled by the heat dissipation plate 5'. Thus, the semiconductor module A2 has an advantage that the electronic components 2' are unlikely to be adversely affected by heat.

According to this embodiment, the semiconductor module A2 can be mounted to a circuit board by using pin-type input terminal 3A', ground terminal 3B' and output terminal 3C'. Generally, when mounting is performed using such pin-type terminals, heat is not easily dissipated and tends to be retained in the substrate, as compared with the case where surface mounting is employed. However, the present embodiment can avoid such a problem, because heat is transferred to the heat dissipation plate 5' through the heat conduction member 17'.

Further, according to this embodiment, three heat conduction members 17' are provided to fill the through-holes 16a', 16b', 16c', respectively, and the three bulging portions 172' are in contact with the heat dissipation plate 5'. Thus, the heat dissipation plate 5' is unlikely to incline, so that the distance between the block 13A' of the reverse wiring pattern 13' and the heat dissipation plate 5' is kept constant. Thus, the heat dissipation plate 5' does not easily come into contact with the block 13B' of the reverse wiring pattern 13', so that unfavorable electrical connection of the blocks 13A' and 13B' is prevented. Thus, the structure of the semiconductor module A2 is suitable for providing a wiring on the reverse side of the substrate 1'.

According to the above-described manufacturing method, the bulging portion 172' is formed naturally, without requiring any special technique, due to surface tension when the solder paste 17A' is melted. Thus, with the above-described manufacturing method, the semiconductor module A2 is made easily.

Another method for making the semiconductor module A2 is described below with reference to FIGS. 23 and 24. However, description is omitted as to the steps common to those of the manufacturing method shown in FIGS. 18-22.

Figure 23:
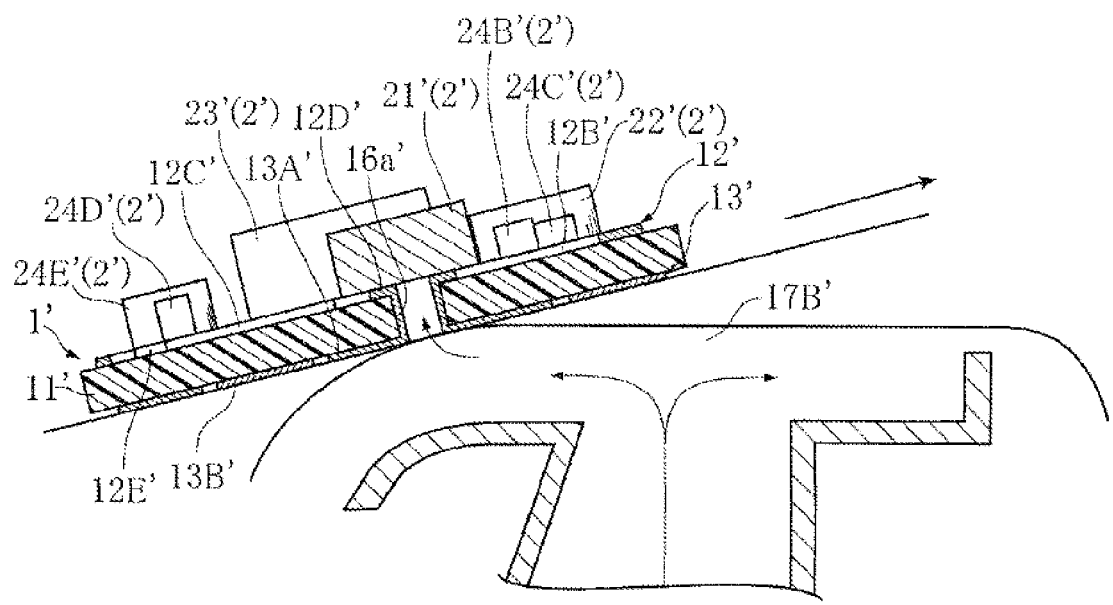
FIG. 23 is a sectional view showing a step of another method for making the semiconductor module shown in FIG. 12.
Figure 24:
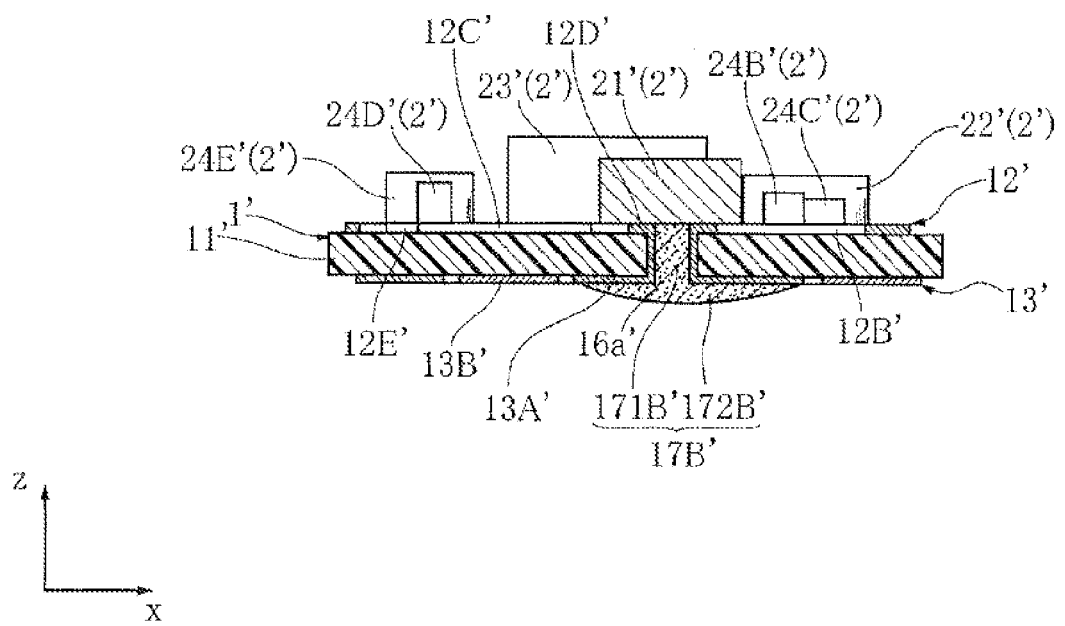
FIG. 24 is a sectional view showing a step subsequent to FIG. 23.

Shown in FIGS. 23 and 24 is a step for forming the heat conduction members 17', which corresponds to FIGS. 19 and 20 in the foregoing manufacturing method. First, in this step, flux is applied to the inner circumferential surfaces of the through-holes 16a', 16b', 16c' and to a region of the reverse surface of the substrate 1' which overlaps the through-holes 16a', 16b', 16c'. Thereafter, as shown in FIG. 23, the substrate 1' is transferred into a solder bath in which solder material 17B' in a liquid state flows, to bring the reverse side of the substrate 1' into contact with the solder material 17B'. Thus, as shown in FIG. 24, the solder material 17B' adheres to the region where the flux has been applied. The adhered solder material 17B' includes a filling portion 171B' filling the through-hole 16a', 16b', 16c' and a bulging portion 172B' adhering to the reverse surface of the substrate 1'. The bulging portion 172B' is formed into a dome shape with a bulging center due to surface tension. The solder material 17B' is hardened, whereby the heat conduction member 17' as shown in FIG. 17' is obtained.

This manufacturing method also allows smooth manufacturing of the semiconductor module A2. With this manufacturing method again, the heat conduction member 17' is formed easily, because the bulging portion 172B' is naturally formed into a dome shape with a bulging center due to surface tension.

Other embodiments of the present invention are described below. In these figures, the elements that are identical or similar to those of the foregoing embodiment are designated by the same reference signs as those used for the foregoing embodiment, and the description is omitted appropriately.

Figure 25:
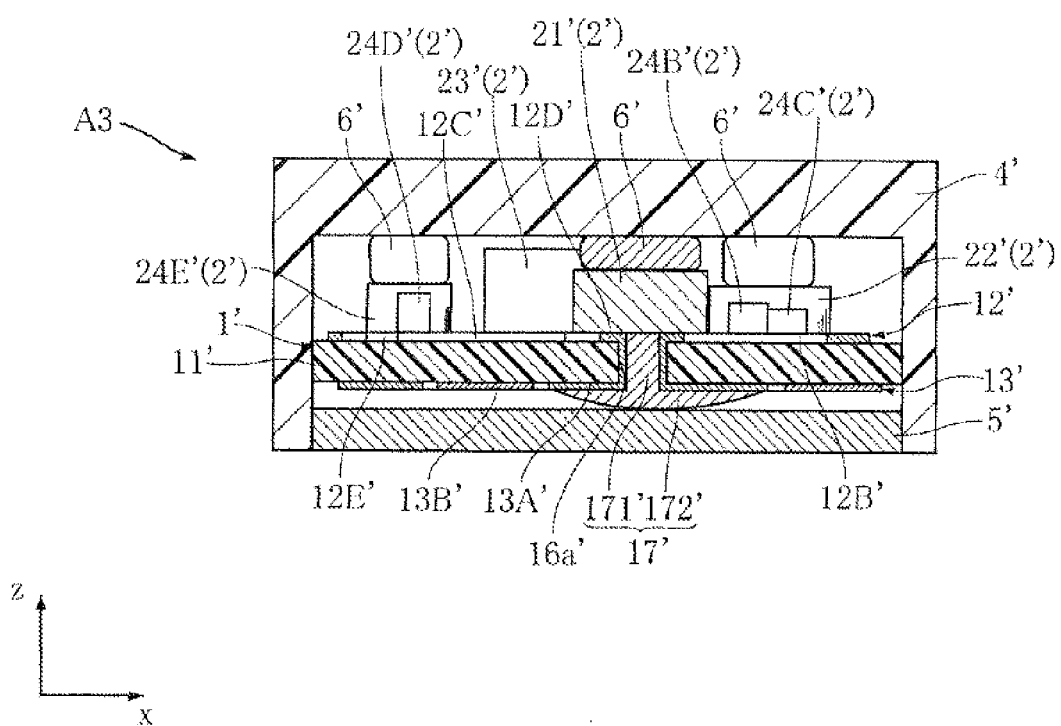
FIG. 25 is a sectional view of a semiconductor module according to a third embodiment of the present invention.
Figure 26:
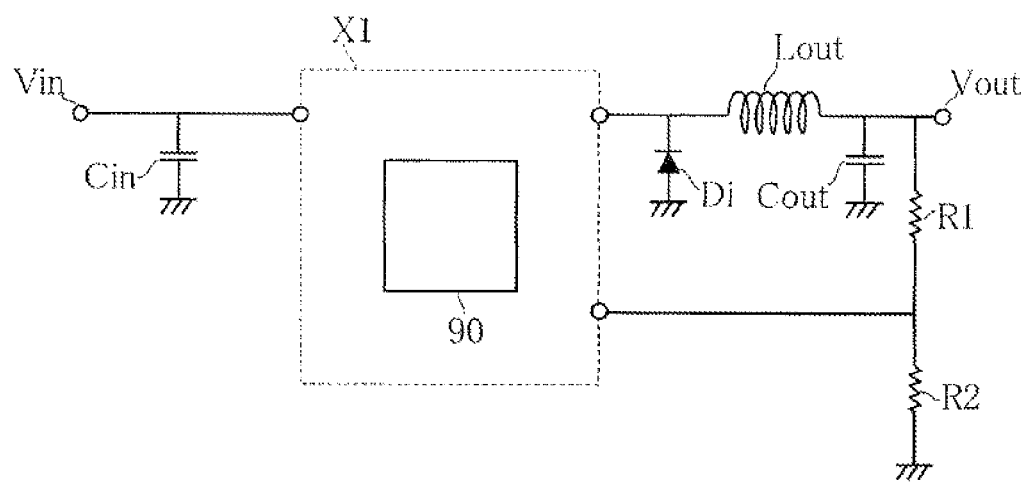
FIG. 26 is an equivalent circuit view of an example of conventional switching regulator.
Figure 27:
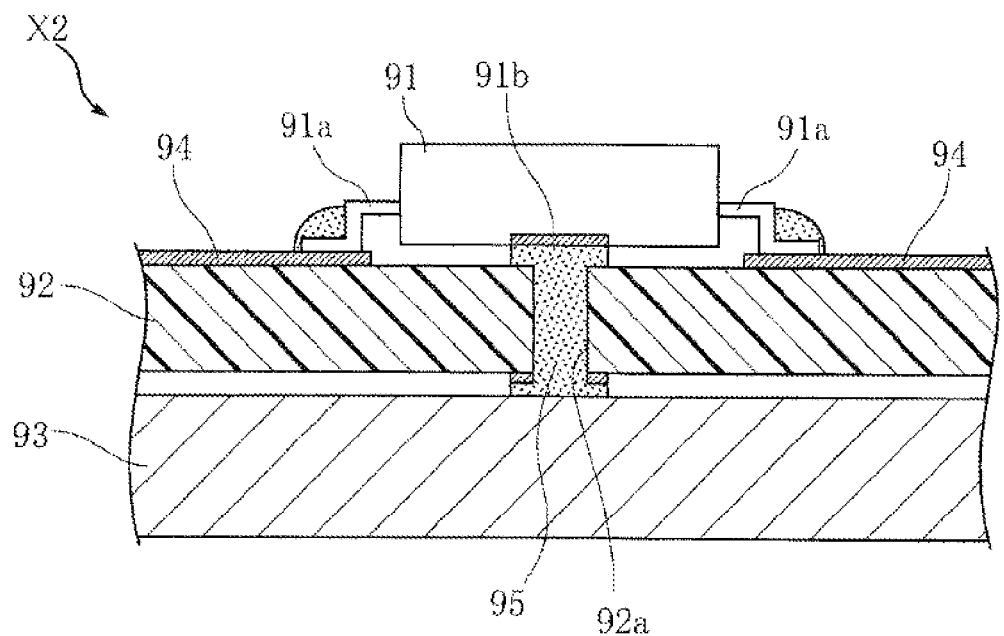
FIG. 27 is a sectional view showing an example of conventional semiconductor module.

FIG. 25 shows a semiconductor module A3 according to a third embodiment of the present invention. In this embodiment, the heat dissipation plate 5' is fixed to the resin package 4' by e.g. riveting. Thus, in the semiconductor module A3, an adhesive (see reference sign 7' in FIG. 17) is not used between the substrate 1' and the heat dissipation plate 5'.

In the semiconductor module A3, the substrate 1' is fixed by sandwiching the substrate between the heat dissipation plate 5' and the resin package 4', and the bulging portion 172' is reliably held in contact with the heat dissipation plate 5'. Thus, in the semiconductor module A3, heat generation at the IC 21', whose heat generation amount is relatively large, is quickly cooled by the heat dissipation plate 5'. Thus, in the semiconductor module A3, the electronic components 2' are unlikely to be adversely affected by heat.

The semiconductor module according to the present invention is not limited to the foregoing embodiments. For instance, although a solder material is used in the foregoing embodiment as a material for the heat conduction member 17', electrically conductive resin such as Ag paste may be used.

Although the heat conduction member 17' is provided at three locations in the foregoing embodiment, the heat conduction member 17' may be additionally provided in a through-hole 15' in a region overlapping the blocks 12D', 13A' as viewed in z direction. The heat conduction member 17' may be provided only in one or both of the through-holes 16a' and 16b'.

In the foregoing embodiment, solder paste 17A' is applied and heated in a reflow furnace after the electronic components 2' are mounted on the substrate 1'. However, the electronic components 2' may be mounted after the solder paste 17A' is applied and heated in a reflow furnace.

The invention claimed is:

1. A DC voltage conversion module comprising:
 a substrate including an obverse surface and a reverse surface;
 an input terminal, an output terminal, a ground terminal;
 a DC voltage conversion control element mounted on the obverse surface of the substrate;

a coil mounted on the obverse surface of the substrate and connected to the DC voltage conversion control element and the output terminal;

an input-side capacitor mounted on the substrate and connected to the input terminal and the ground terminal; and an output-side capacitor mounted on the substrate and connected to the output terminal and the ground terminal, wherein:

the input terminal, the output terminal, and the ground terminal project in a predetermined projecting direction on and along a same single plane, the input terminal, the output terminal, and the ground terminal being positioned parallel to each other, the ground terminal is arranged between the input terminal and the output terminal in a direction perpendicular to the projecting direction, the substrate is formed with an obverse wiring pattern formed on the obverse surface, a reverse wiring pattern formed on the reverse surface, at least one through-hole penetrating the substrate and overlapping the obverse and the reverse wiring patterns as viewed in a thickness direction of the substrate, and a solder portion filling the through-hole, the input-side and the output-side capacitors are mounted on the obverse surface of the substrate, and the reverse wiring pattern includes a first block connected to the ground terminal and including a projecting portion projecting in the projecting direction to an opposite side of the input, the output and the ground terminals, and a second block having a U-shape surrounding the projecting portion.

2. The DC voltage conversion module according to claim 1, wherein the coil is interposed between the input, the output and the ground terminals and the DC voltage conversion control element in the projecting direction.

3. The DC voltage conversion module according to claim 2, wherein, in the direction perpendicular to the projecting direction, the output-side capacitor is aligned with the coil and positioned on the output terminal side.

4. The DC voltage conversion module according to claim 3, wherein, in the projecting direction, the input-side capacitor is adjacent to the output-side capacitor and arranged on an opposite side of the input, the output and the ground terminals.

5. The DC voltage conversion module according to claim 3, further comprising a fuse mounted on the substrate, connected to the input terminal and the DC voltage conversion control element, and arranged on an opposite side of the coil from the output-side capacitor in the direction perpendicular to the projecting direction.

6. The DC voltage conversion module according to claim 1, wherein the first block is larger in area than the second block.

7. The DC voltage conversion module according to claim 1, further comprising a heat dissipation plate bonded to a reverse surface of the substrate.

8. The DC voltage conversion module according to claim 1, wherein the through-hole is provided at a position overlapping the DC voltage conversion control element.

9. A DC voltage conversion module comprising:
a substrate including an obverse surface and a reverse surface;
an input terminal, an output terminal, a ground terminal;
a DC voltage conversion control element mounted on the obverse surface of the substrate;
a coil mounted on the obverse surface of the substrate and connected to the DC voltage conversion control element and the output terminal;
an input-side capacitor mounted on the substrate and connected to the input terminal and the ground terminal; and
an output-side capacitor mounted on the substrate and connected to the output terminal and the ground terminal, wherein:
the input terminal, the output terminal, and the ground terminal project in a predetermined projecting direction on and along a same single plane, the input terminal, the output terminal, and the ground terminal being positioned parallel to each other,
the ground terminal is arranged between the input terminal and the output terminal in a direction perpendicular to the projecting direction,
the substrate is formed with an obverse wiring pattern formed on the obverse surface, a reverse wiring pattern formed on the reverse surface, at least one through-hole penetrating the substrate and overlapping the obverse and the reverse wiring patterns as viewed in a thickness direction of the substrate, and a solder portion filling the through-hole,
the through-hole is provided at a position overlapping the DC voltage conversion control element, and
the substrate is formed with an additional through-hole, the obverse wiring pattern includes a block in which the DC voltage conversion control element is mounted, and the block includes a region located at a position that does not overlap the DC voltage conversion control element and formed with the additional through-hole.

* * * * *